United States Patent
Economikos et al.

(10) Patent No.: US 10,157,796 B1
(45) Date of Patent: Dec. 18, 2018

(54) FORMING OF MARKING TRENCHES IN STRUCTURE FOR MULTIPLE PATTERNING LITHOGRAPHY

(71) Applicant: GLOBALFOUNDRIES Inc., Grand Cayman (KY)

(72) Inventors: Laertis Economikos, Wappingers Falls, NY (US); Chanro Park, Clifton Park, NY (US); Ruilong Xie, Schenectady, NY (US); Pei Liu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/811,953

(22) Filed: Nov. 14, 2017

(51) Int. Cl.
| | |
|---|---|
| *H01L 21/8234* | (2006.01) |
| *H01L 31/05* | (2014.01) |
| *H01L 21/311* | (2006.01) |
| *H01L 23/544* | (2006.01) |
| *H01L 21/027* | (2006.01) |
| *H01L 21/3105* | (2006.01) |
| *H01L 29/66* | (2006.01) |
| *H01L 21/02* | (2006.01) |

(52) U.S. Cl.
CPC .. *H01L 21/823437* (2013.01); *H01L 21/0276* (2013.01); *H01L 21/02186* (2013.01); *H01L 21/31058* (2013.01); *H01L 21/31144* (2013.01); *H01L 21/823431* (2013.01); *H01L 23/544* (2013.01); *H01L 29/6656* (2013.01); *H01L 29/66545* (2013.01); *H01L 29/66553* (2013.01); *H01L 2223/54426* (2013.01)

(58) Field of Classification Search
None
See application file for complete search history.

(56) References Cited

U.S. PATENT DOCUMENTS

| | | |
|---|---|---|
| 6,383,931 B1 | 5/2002 | Flanner et al. |
| 8,846,491 B1 | 9/2014 | Pham et al. |
| 8,916,460 B1 | 12/2014 | Kwon et al. |
| (Continued) | | |

OTHER PUBLICATIONS

Branislav Curanovic, "Development of a fully-depleted thin-body FinFET process", (2003) Thesis. Rochester Institute of Technology. 130 pages.

(Continued)

*Primary Examiner* — Asok K Sarkar
(74) *Attorney, Agent, or Firm* — Francois Pagette; Hoffman Warnick LLC

(57) ABSTRACT

The disclosure relates to methods including: forming a soft mask; forming a first marking trench within a portion of the soft mask by selectively removing a portion of the soft mask at a first location, over one of a pair of gate trenches; forming an insulative liner on the soft mask and within the first marking trench; forming an anti-reflective film on the insulative liner and within the first marking trench; selectively removing the anti-reflective film and the insulative liner at a second location to expose a portion of the soft mask positioned over the other one of the pair of gate trenches; forming a second marking trench by removing another portion of the soft mask at the second location; and removing a portion of the soft mask at the first and second marking trenches to expose a lower surface of each of the pair of gate trenches.

20 Claims, 15 Drawing Sheets

(56) References Cited

U.S. PATENT DOCUMENTS

| | | |
|---|---|---|
| 9,171,752 B1 | 10/2015 | Wu et al. |
| 9,263,516 B1 | 2/2016 | Wu et al. |
| 9,337,099 B1 | 5/2016 | Jain et al. |
| 9,425,252 B1 | 8/2016 | Zang et al. |
| 9,406,676 B2 | 9/2016 | Yu et al. |
| 9,653,579 B2 | 5/2017 | Liu et al. |
| 9,653,642 B1 | 5/2017 | Raring et al. |
| 2009/0081815 A1 | 3/2009 | Yamashita et al. |
| 2009/0242513 A1 | 10/2009 | Funk et al. |
| 2010/0036518 A1 | 2/2010 | Funk et al. |
| 2010/0311231 A1* | 12/2010 | Thei ................ H01L 21/823842 438/587 |
| 2014/0001572 A1 | 1/2014 | Bohr et al. |
| 2014/0117454 A1 | 5/2014 | Liu et al. |
| 2015/0104918 A1 | 4/2015 | Liu et al. |
| 2015/0171082 A1* | 6/2015 | Choi ................ H01L 21/82345 257/392 |
| 2016/0110489 A1 | 4/2016 | Schroeder et al. |
| 2016/0111524 A1 | 4/2016 | Ha et al. |
| 2016/0133632 A1 | 5/2016 | Park et al. |
| 2016/0190130 A1 | 6/2016 | Yu et al. |
| 2017/0051884 A1 | 2/2017 | Raring et al. |
| 2017/0098581 A1* | 4/2017 | Ho ........................ H01L 27/088 |
| 2017/0236712 A1* | 8/2017 | Hsieh .................. H01L 21/0337 438/531 |

OTHER PUBLICATIONS

Chiao-Ti Huang, "Electrical and Material Properties of Strained Silicon/Relaxed Silicon Germanium Heterostructures for Single-Electron Quantum Dot Applications", A Dissertation Presented to the Faculty of Princeton University in Candidacy for the Degree of Doctor of Philosophy, 127 pages. (Jun. 2015).

Yu-Chih Tseng, "Interfaces and Junctions in Nanoscale Bottom-Up Semiconductor Devices", Electrical Engineering and Computer Sciences University of California at Berkeley Technical Report No. UCB-EECS-2009-65, 120 pages (May 17, 2009).

* cited by examiner

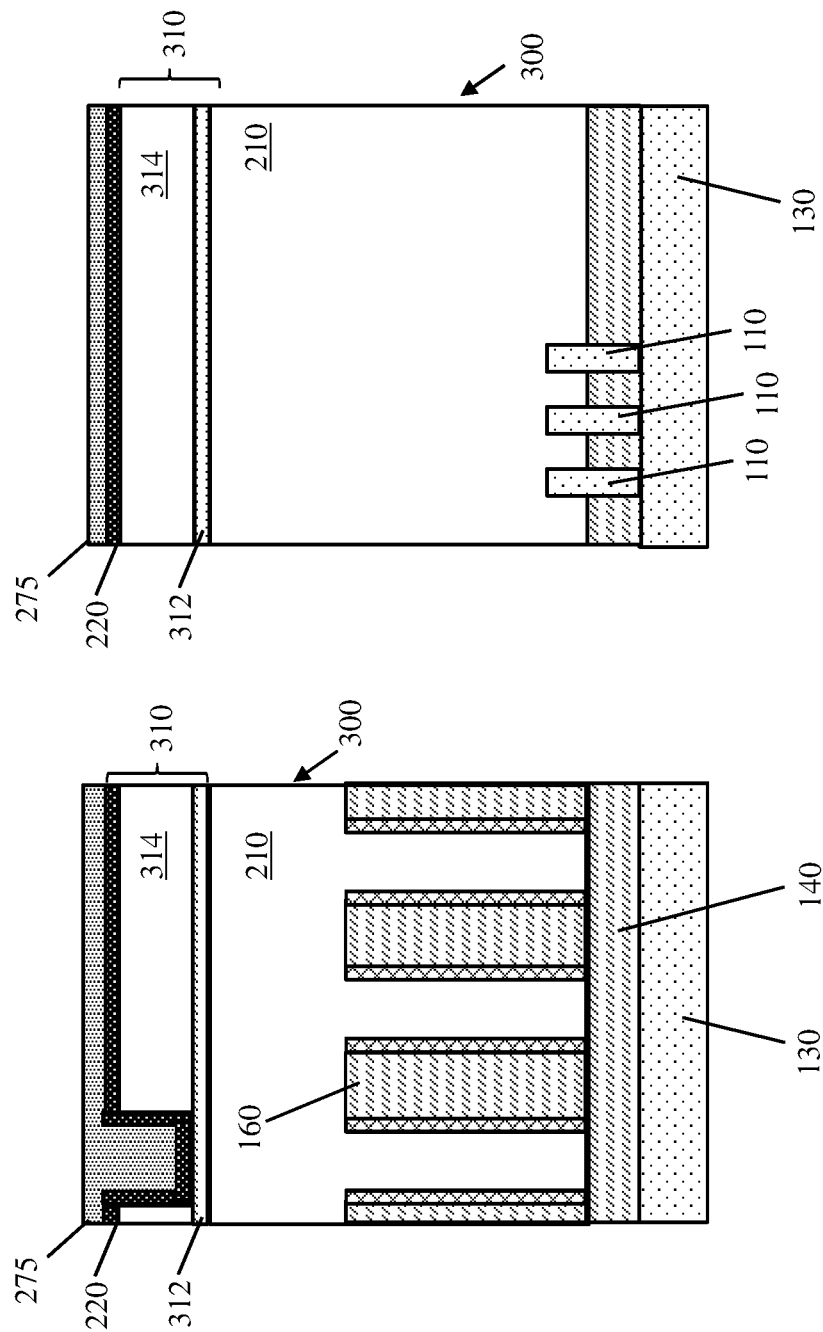

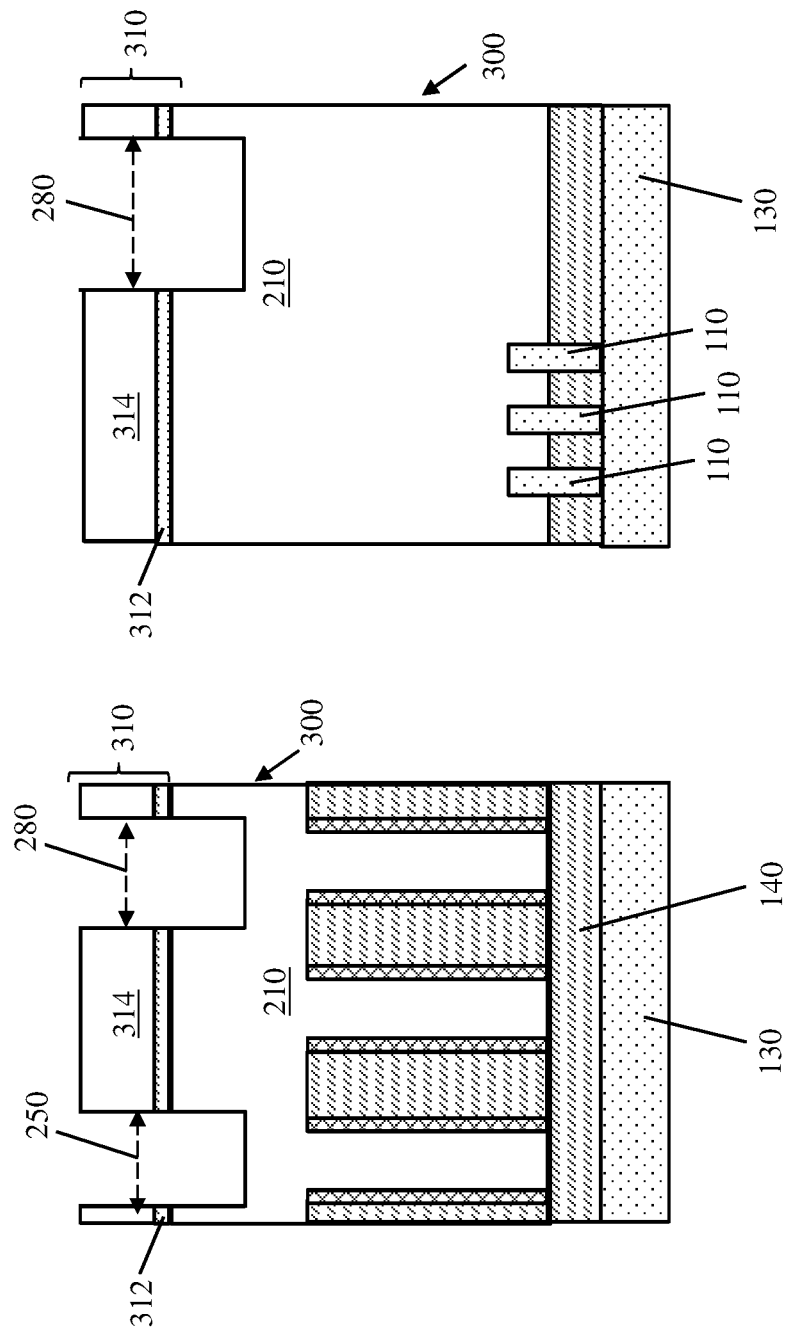

FORMING OF MARKING TRENCHES IN STRUCTURE FOR MULTIPLE PATTERNING LITHOGRAPHY

BACKGROUND

Technical Field

The present application relates to methods of forming marking trenches for multiple patterning lithography. More particularly, the present application relates to processing techniques for creating pairs of marking trenches within a structure, each being associated with a color in multiple patterning lithography, without violating design rules.

Related Art

Design systems are commonly used to create integrated circuits (ICs) and, in particular, to model and produce front end of line (FEOL) interconnect structures. As advances occur, smaller widths for wires and vias are provided. For example, seven nanometer node design rules may allow only uni-directional wiring at any metal layer, which precludes the use of two-dimensional designs in a metal layer. FEOL design must comply with these design rules before manufacture. Design rule spacing constraints for an integrated circuit can limit a variety of attributes, e.g., the maximum separation distance between adjacent gates in a cell array. Such constraints can affect the ability to form functional elements which connect gates and/or other structures together, e.g., two or more vias connecting to nearby positions of a single device layer.

Double patterning lithography is one type of multiple patterning lithography technology that has been in use for some time. Double patterning lithography generally involves placing shapes that are too close to each other to be assigned to the same mask layer onto two different mask layers in order to satisfy spacing requirements specified in the design layout. These two different mask layers are then used to print one design layer. Other multiple patterning lithography options such as triple patterning lithography may use more than two masks. To prepare for the use of multiple masks, conventional processing techniques may include forming one or more marking trenches, also known as a "memorization trench" or "memorization etch," in the structure to identify locations to be processed by way of multiple patterning lithography. A disadvantage to this process may include the need to create three groups of marking trenches in a design, each associated with a particular reference color (e.g., green for one layer, blue for another layer, and red for another layer), to provide the correct number of masking layers. Preparing a structure for multiple patterning lithography also prevents spacers from being formed alongside a gate or similar structure until after the marking trenches are ready.

SUMMARY

A first aspect of the disclosure provides an integrated circuit (IC) structure, including: forming a soft mask on an upper surface of an insulator, and within a pair of gate trenches extending below the upper surface of an insulator; forming a first marking trench within the soft mask by selectively removing a portion of the soft mask at a first location, over one of the pair of gate trenches; forming an insulative liner on the soft mask and within the first marking trench; forming an anti-reflective film on the insulative liner and within the first marking trench; selectively removing the anti-reflective film and the insulative liner at a second location to expose a portion of the soft mask positioned over the other one of the pair of gate trenches; forming a second marking trench by removing another portion of the soft mask at the second location; and removing a portion of the soft mask at the first and second marking trenches to expose a lower surface of each of the pair of gate trenches.

A second aspect of the disclosure provides a method of forming an integrated circuit (IC) structure, the method including: forming a soft mask on an upper surface of an insulator, and within a pair of gate trenches extending below the upper surface of an insulator, the soft mask including: an organic planarization layer (OPL) positioned on an upper surface of the insulator and within the pair of gate trenches, a capping insulator positioned on the OPL, and a first anti-reflective film positioned on the OPL; forming a first marking trench by selectively removing the first anti-reflective film and a portion of the capping insulator at a first location; forming an insulative liner on the capping insulator and within the first marking trench; forming a second anti-reflective film on the insulative liner and within the first marking trench; forming a second marking trench by selectively removing the second anti-reflective film, the insulative liner, and another portion of the capping insulator at a second location; and removing the capping insulator and the OPL at the first and second marking trenches to expose a lower surface of each of the pair of gate trenches.

A third aspect of the disclosure provides a method of forming an integrated circuit (IC) structure, including: forming a soft mask on an upper surface of an insulator, and within a pair of gate trenches extending below the upper surface of an insulator, the soft mask including: an organic planarization layer (OPL) positioned on an upper surface of the insulator and within the pair of gate trenches, a capping insulator positioned on the OPL, and a first anti-reflective film positioned on the OPL; forming a first marking trench by selectively removing the first anti-reflective film and a portion of the capping insulator at a first location; forming an insulative liner on the capping insulator and within the first marking trench; forming a second anti-reflective film on the insulative liner and within the first marking trench; forming a second marking trench by selectively removing the second anti-reflective film, the insulative liner, and another portion of the capping insulator at a second location; and removing the capping insulator and the OPL at the first and second marking trenches to expose a lower surface of each of the pair of gate trenches.

BRIEF DESCRIPTION OF THE DRAWINGS

The embodiments of this disclosure will be described in detail, with reference to the following figures, wherein like designations denote like elements, and wherein:

FIG. 21 shows a lateral cross-sectional view of forming a first marking trench and forming a precursor anti-reflective film on the soft mask according to the disclosure.

FIG. 22 shows a longitudinal cross-sectional view of forming a first marking trench and forming a precursor anti-reflective film on the soft mask according to the disclosure.

FIG. 25 shows a lateral cross-sectional view of removing portions of an organic planarization region (OPL) within the soft mask according to the disclosure.

FIG. 26 shows a longitudinal cross-sectional view of removing portions of an organic planarization region (OPL) within the soft mask according to the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely exemplary.

Figure 1:
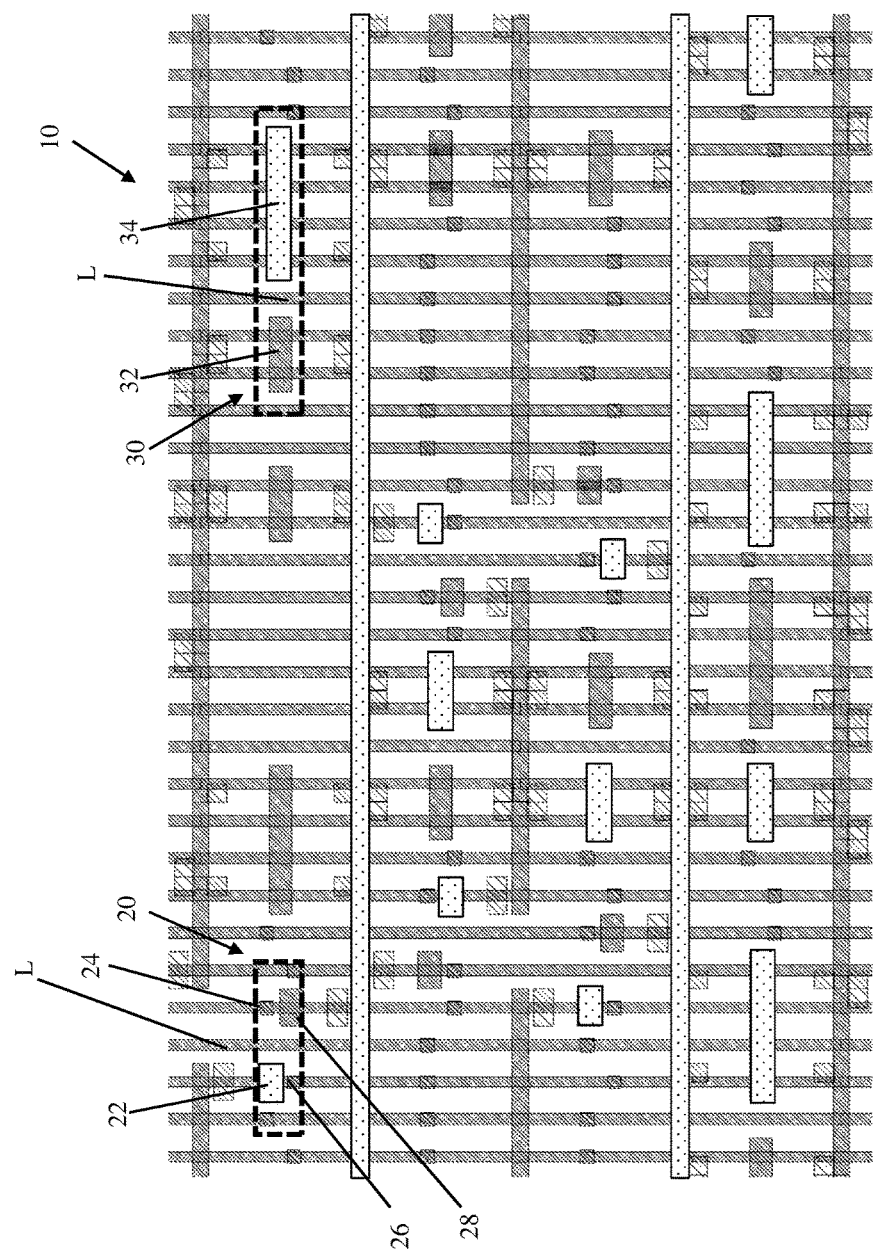
FIG. 1 shows a plan view of an integrated circuit (IC) design to be fabricated according to the disclosure.

Referring to FIG. 1, the present disclosure relates to methods for preparing and/or manufacturing one or more integrated circuit (IC) structures to be processed with the aid of multiple patterning lithography. More specifically, embodiments of the disclosure allow for the creation of two or more marking trenches using a single soft mask, and without forming additional soft mask assemblies for the additional marking trenches. FIG. 1 depicts a plan view of an IC design 10 to be manufactured according to the present disclosure. To provide the different mask layers for fabricating IC design 10, the layout may be divided into three different masks each associated with a particular color. Thus, the various features in IC design 10 are shown with different cross-hatching (e.g., solid textures, dotted textures, and diagonal lines), each corresponding to one of the colors associated with a particular mask in multiple patterning lithography.

A first section 20 and a second section 30 of IC design 10 are identified separately with dotted lines to show where methods according to the disclosure may be implemented. First section 20 includes a group of four features 22, 24, 26, 28 and an intermediate line L, which may correspond to a functional gate or a gate structure configured for eventual replacement with a metal gate structure. Two features 22, 26 in first section 20 are on one side of intermediate line L, while two other features 24, 28 are on the other side of intermediate line L. The differences in color between horizontally aligned features 22, 24 and horizontally aligned features 26, 28 on opposite sides of intermediate line L allows first section 20 to be printed accurately by way of conventional multiple patterning techniques. Second section 30, by contrast, includes two horizontally aligned features 32, 34 on opposite sides of intermediate line L, but having different colors for multiple patterning lithography. Memorization features (i.e., marking trenches discussed herein for targeted feature formation) typically must be formed in second section 30, or similar arrangements, to accommodate the close horizontal proximity of features 26, 28 as compared to the staggered arrangement of first section 20. Alignment trenches or other memorization features may allow isolation regions to be formed in the resulting structure, e.g., to electrically separate the conductive regions of two nearby features. Embodiments of the disclosure provide a method of forming distinct alignment trenches for multiple patterning lithography, while using only one soft mask to form multiple alignment trenches. The present disclosure is operable for use with any two features in a structure, even in cases where only one intermediate line (e.g., intermediate line L of second region 30) separates the two features from each other.

Figure 2:
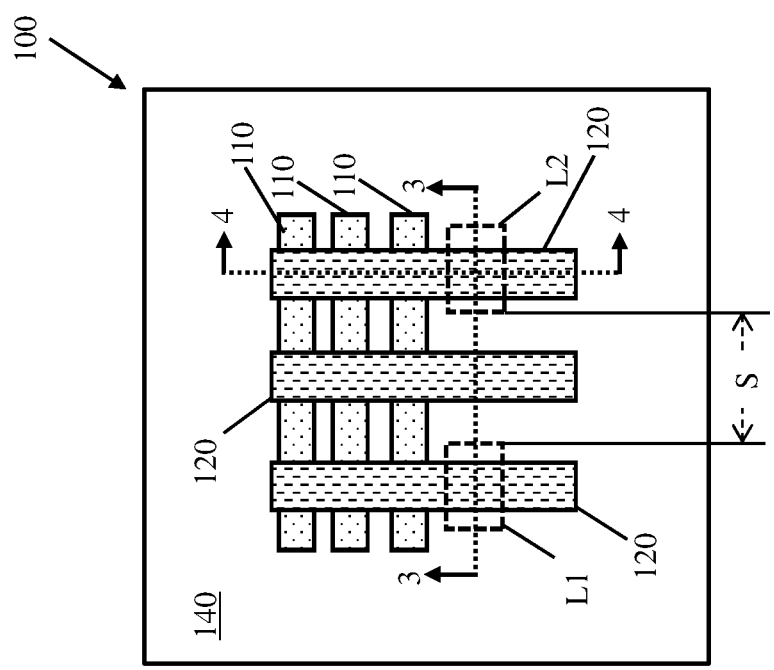
FIG. 2 shows a plan view of a structure targeted for multiple patterning lithography according to the disclosure.

FIG. 2 provides a plan view of a structure 100 to be processed according to the present disclosure. The example structure 100 of FIG. 2 illustrates one IC design where the disclosure may be implemented, but it is understood that embodiments of the disclosure can be implemented on different designs without any change to the techniques discussed herein. Structure 100 can include a set (i.e., one or more) of fins 110 extending in a first direction, with three fins 110 being provided for the sake of example. Structure 100 may also include a set (i.e., one or more) gate structures 120 extending transversely over fins 110, with each gate structure 120 having one or more regions positioned over corresponding fin(s) 110 in structure 100. A shallow trench isolation 140 (shown without cross-hatching in FIG. 2 solely for clarity) of structure 100, may be positioned underneath and/or adjacent to fin(s) 110 and gate structure(s) 120. A design rule for a product may include two locations L1, L2, where gate structure(s) 120 must be removed for replacement with an electrically conductive or insulative material. The disclosure can be implemented upon locations L1, L2 in close proximity to each other, such that a distance S between locations L1, L2 is at most approximately ten nanometers (nm). A single gate structure 120 of structure 100 may be between locations L1, L2 in some embodiments, or multiple gate structures 120 may be present between each location L1, L2 in other embodiments. Further illustration of methods according to the disclosure is provided by reference to a lateral cross-section of FIG. 2 (e.g., along line 3-3), depicted in odd-numbered FIGS., and a longitudinal cross-section of FIG. 2 (e.g., along line 4-4), depicted in even-numbered FIGS. It should be emphasized that fins 110 are absent from structure 100 along the lateral cross-section of structure 100.

Figure 3:
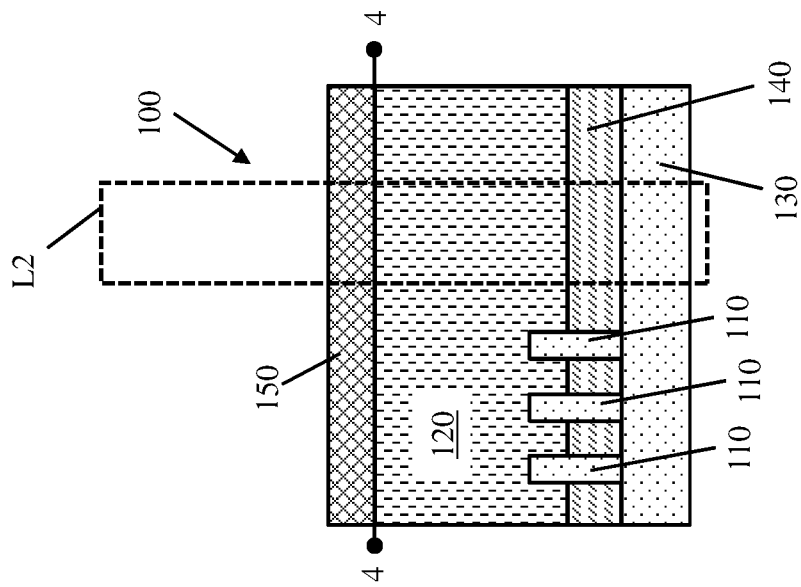
FIG. 3 shows a lateral cross-sectional view of the structure along line 3-3 in FIG. 2 according to the disclosure.
Figure 4:
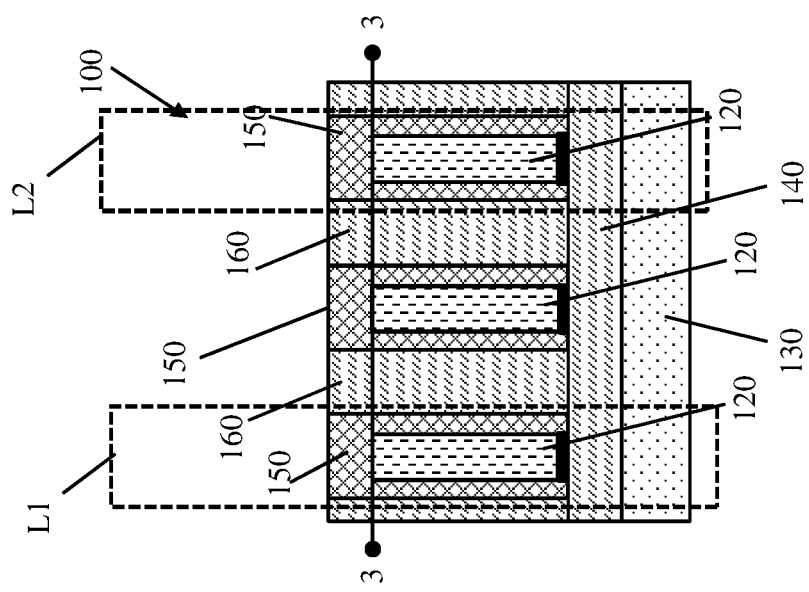
FIG. 4 shows a longitudinal cross-sectional view of the structure along line 4-4 in FIG. 2 according to the disclosure.

Referring to FIGS. 3-4, together, the various components of structure 100 are discussed in further detail to better illustrate subsequent processing in embodiments of the disclosure. First and second locations L1, L2 are also depicted in FIGS. 3-4 for the sake of comparison with FIG. 2. Each fin 110 can be formed from an underlying semiconductor substrate 130, e.g., by removing targeted portions of substrate 130 to a predetermined depth, causing the non-removed portions to form fins 110 directly on substrate 130. Substrate 130 can include, e.g., one or more currently-known or later developed semiconductive substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Structure 100 may include at least one shallow trench isolation (STI) 140 positioned on substrate 130, as well as between fins 110 and gate structures 120. Each STI 140 may be formed of any currently-known or later developed substance for providing electrical insulation, and as examples may include, e.g., silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Each gate structure 120 may not include all functional components used in a complete IC structure, and may include one or more dummy gates to be processed at a different stage of forming a product. Gate structures 120 thus may cover one or more semiconductor fins 110 positioned above substrate 130, e.g., by coating exposed sidewalls and an upper surface of fin(s) 110. Gate structure(s) 120 can also include corresponding gate spacers 150. Gate spacer(s) 150 can be provided as one or more bodies of insulating material formed on exposed portions of STI(s) 140 and/or gate structure(s) 120, e.g., by deposition, thermal growth, etc., and may include materials and/or other structures formed on or adjacent to gate structure(s) 120 to electrically and physically insulate gate structure(s) 120 from other components of structure 100. In an example embodiment, gate spacer(s) 150 can be provided as a region of silicon nitride (SiN) with or without other insulating materials being included therein. The lateral space between gate spacer(s) 150 in structure 100 can be occupied by one or more insulators 160, which may include the same insulating material as STI(s) 140 or may include a different electrically insulative structure. STI(s) 140 and insulator 160 nonetheless constitute different components, e.g., due to STI(s) 140 being formed before gate structure(s) 120, and insulator 160 being formed on fin(s) 110, gate structure(s) 120, and STI(s) 140 together.

Figure 5:
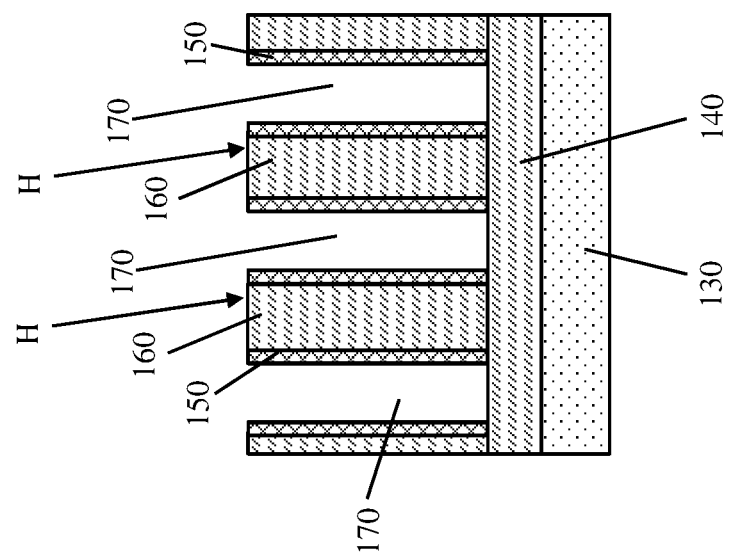
FIG. 5 shows a lateral cross-sectional view of forming gate trenches and a gate dielectric layer according to the disclosure.
Figure 6:
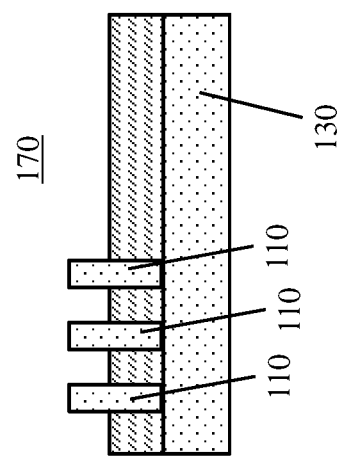
FIG. 6 shows a longitudinal cross-sectional view of forming gate trenches and a gate dielectric layer according to the disclosure.

Turning to FIGS. 5 and 6, targeted gate structure(s) 120 may need to be removed and replaced with new materials to provide the alignment trenches or similar memorization features described herein. The removed gate structure(s) 120 can subsequently be replaced with masking materials as described herein. FIGS. 5 and 6 depict the applying of a selective etchant to gate structure(s) 120 and their gate spacer(s) 150 to remove gate structure(s) 120 and gate spacer(s) 150 while leaving STI(s) 140 and insulator 160 intact. The selective removing of gate structure(s) 120 and gate spacer(s) 150 may form a set of gate trenches 170 where gate structure(s) 120 were previously located on STI(s) 140. Gate trenches 170 thus extend below an upper surface H of insulator 160 to expose STI(s) 140 and sidewalls of insulator 160. As shown by example in FIG. 5, some portions of gate spacer(s) 150 may remain intact after gate structure(s) 120 have been removed, e.g., due to differences in the etch selectivity of gate spacer(s) 150. It is also understood that gate spacer(s) 150 may be completely removed with gate structure(s) 120 in further embodiments.

Figure 8:
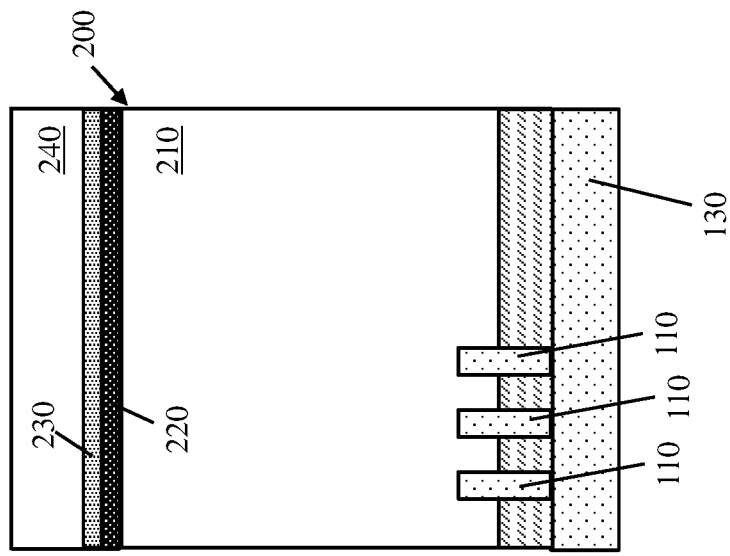
FIG. 8 shows a longitudinal cross-sectional view of forming a soft mask according to the disclosure.
Figure 7:
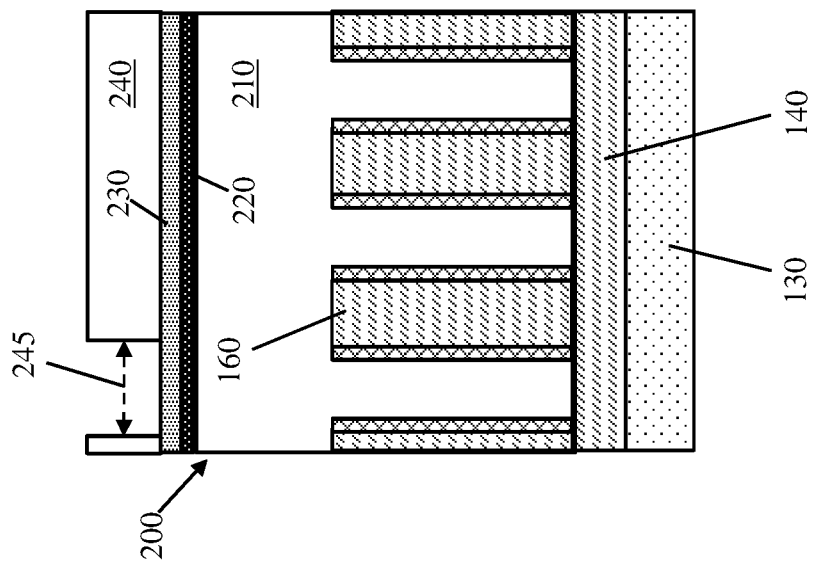
FIG. 7 shows a lateral cross-sectional view of forming a soft mask according to the disclosure.

Referring now to FIGS. 7 and 8, continued processing according to the disclosure includes forming a soft mask 200 on insulator 160 and within gate trenches 170. Soft mask 200 can be structured to cover fin(s) 110, substrate 130, STI(s) 140, and insulator 160, and may include multiple layers of material as described herein. Soft mask 200 serves as a material for initially forming alignment trenches for use in multiple patterning lithography, and processes of creating alignment trenches within soft mask 200 are described elsewhere herein. Soft mask 200 can include a planarization layer 210 structured to cover fin(s) 110, substrate 130, STI(s) 140, and insulator 160, thereby defining a substantially planar upper surface. Planarization layer 210 may be deposited by forming an organic planarization layer (OPL) or similar material via spin on deposition, i.e., a process used to deposit uniform thin films on a structure, or other non-conformal depositing techniques. The amount of deposited material may be controlled such that planarization layer 210 completely covers each fin 110 and gate structure 120, in addition to filling multiple gate trenches 170. In the example of FIGS. 7 and 8, three gate trenches 170 are filled with planarization layer 210 such that a single gate trench 170 is filled between two gate trenches 170 where targeted features may be formed in later processing.

Continued fabrication of soft mask 200 may include forming an anti-reflective coating 220 on planarization layer 210. The composition of anti-reflective coating 220 may include any currently known or later developed substance selected for permitting light passage therethrough, and/or for allowing additional anti-reflective films to be formed thereon. Examples of such materials suitable for anti-reflective coating 220 may include, e.g., a silicon-containing antireflective coating (SiARC), a silicon oxynitride (SiON) material, and/or a low temperature oxide (LTO) material. Planarization layer 210 and anti-reflective coating 220 may together define the composition of soft mask 200, or soft mask 200 may include only planarization layer 210 and/or other soft masking materials in alternative embodiments.

After forming soft mask 200, further processing according to the disclosure may include forming a precursor anti-reflective film 230 on soft mask 200. Precursor anti-reflective film 230 may be distinguished from other reflective films discussed herein solely by being targeted for removal after forming at least one marking trench. Precursor anti-reflective film 230 may include any currently known or later developed substance configured to reduce the reflection of light during lithography, e.g., one or more bottom anti-reflective coatings (BARC) and/or similar materials. In some cases, precursor anti-reflective film 230 may be omitted where anti-reflective coating 220 is included on planarization layer 210. Precursor anti-reflective film 230 thus may enhance the capabilities of anti-reflective coating 220 by being positioned directly thereon.

Further processing may include forming a photoresist layer 240 above soft mask 200. The term "photoresist layer" or "photoresist material," as used herein, refers to any currently known or later developed photo-sensitive material used in photolithography to transfer a pattern from a mask onto a wafer. Photoresist materials may include liquids deposited on the surface of the wafer as a thin film, which is then solidified by low temperature anneal. Photoresist layer 240 may be used to pattern soft mask 200 from its initial form in order to define the shape and position of alignment trenches in subsequent processing. Where applicable, photoresist layer 240 may be removed (e.g., by stripping) to uncover any underlying materials after any such materials have been processed. Photoresist layer 240 may be structured to include an opening 245, thereby exposing soft mask 200 or precursor anti-reflective film 230 and to target the underlying structure for photolithographic processing.

Figure 10:
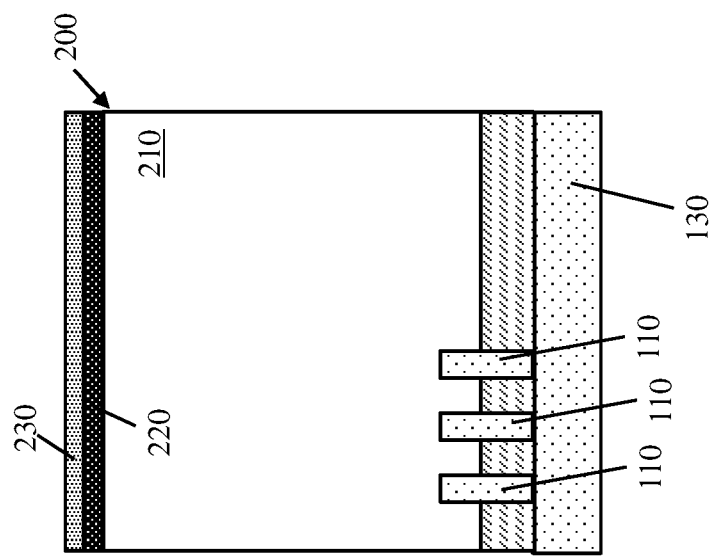
FIG. 10 shows a longitudinal cross-sectional view of removing a portion of the soft mask at a first location according to the disclosure.
Figure 9:
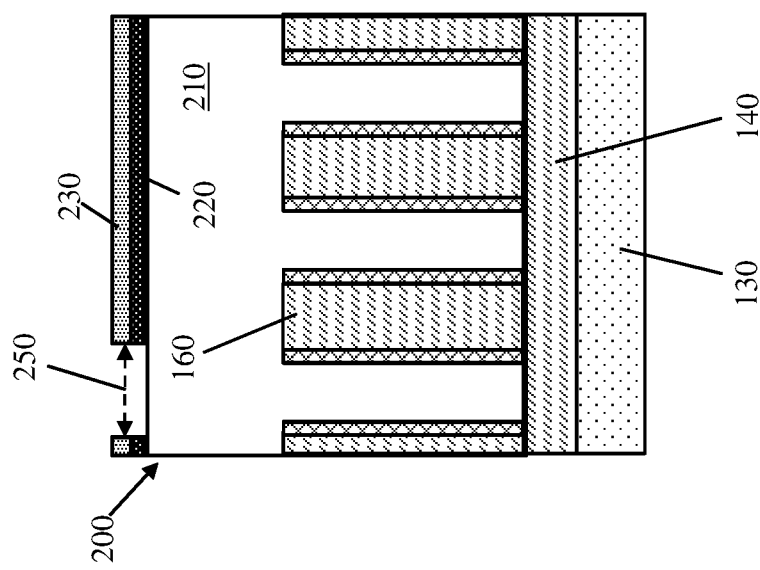
FIG. 9 shows a lateral cross-sectional view of removing a portion of the soft mask at a first location according to the disclosure.

Proceeding to FIGS. 9 and 10, the method may include forming a first alignment trench 250 in precursor anti-reflective film 230, anti-reflective coating 220 of soft mask 200, and/or underlying portions of planarization layer 210 in soft mask 200. First alignment trench 250 may be formed with the aid of photoresist layer 240 and opening 245 (FIGS. 7 and 8), e.g., by etching exposed portions of precursor anti-reflective film 230, anti-reflective coating 220 of soft mask 200, and/or underlying portions of planarization layer 210 while photoresist layer 240 is in place. Soft mask 200, e.g., a portion of planarization layer 210, may be exposed for processing within first alignment trench 250. It is noted that the position of opening 245 within photoresist layer 240 may cause other portions of soft mask 200 or precursor anti-reflective film 230 to remain intact after photoresist layer 240 is removed (e.g., as depicted in FIG. 10).

Figure 12:
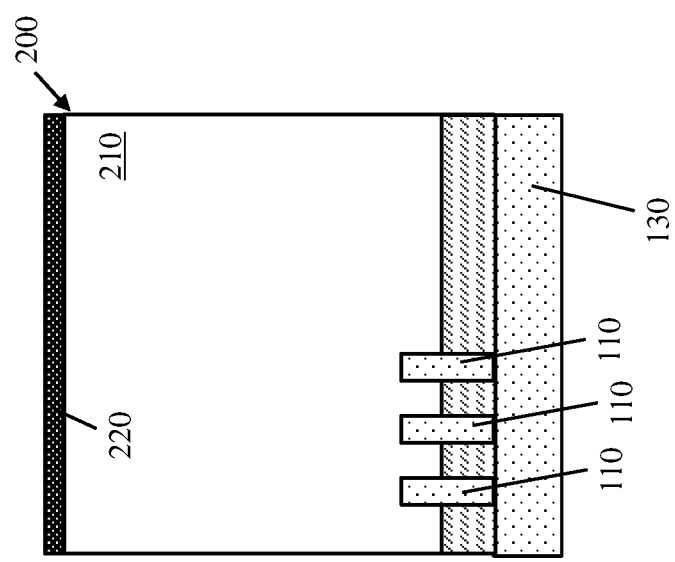
FIG. 12 shows a longitudinal cross-sectional view of forming a first marking trench in the soft mask according to the disclosure.
Figure 11:
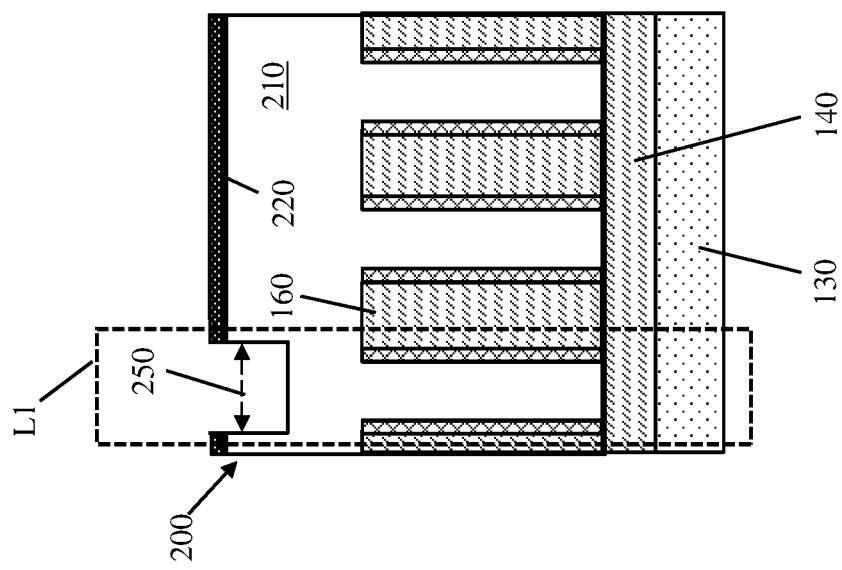
FIG. 11 shows a lateral cross-sectional view of forming a first marking trench in the soft mask according to the disclosure.

Turning to FIGS. 11 and 12, further processing according to the disclosure may include deepening of first alignment trench 250 within soft mask 200. Here, precursor anti-reflective film 230 (FIGS. 7-10) can be selectively removed by stripping, selective etching, and/or other methods for removing an anti-reflective material from a structure without affecting other materials. Anti-reflective coating 220 may remain intact on planarization layer 210 due to underlying differences in composition relative to precursor anti-reflective film 230, and/or differences in size or position. Additional portions of planarization layer 210 or other structures in soft mask 200 can be removed by a vertical selective etching without affecting the remaining portions of anti-reflective coating 220, and to a desired depth within soft mask 200. The depth of first alignment trench 250, at this stage, can vary between implementations so long as first alignment trench 250 extends at least partially into soft mask 200. The deepening of first alignment trench 250 allows for first alignment trench 250 to be expanded further in subsequent processing of the structure. First alignment trench 250 is also positioned at first location L1 over a single gate trench 170 (FIGS. 5 and 6) to allow gate trench 170 to be uncovered in later processes.

Figure 14:
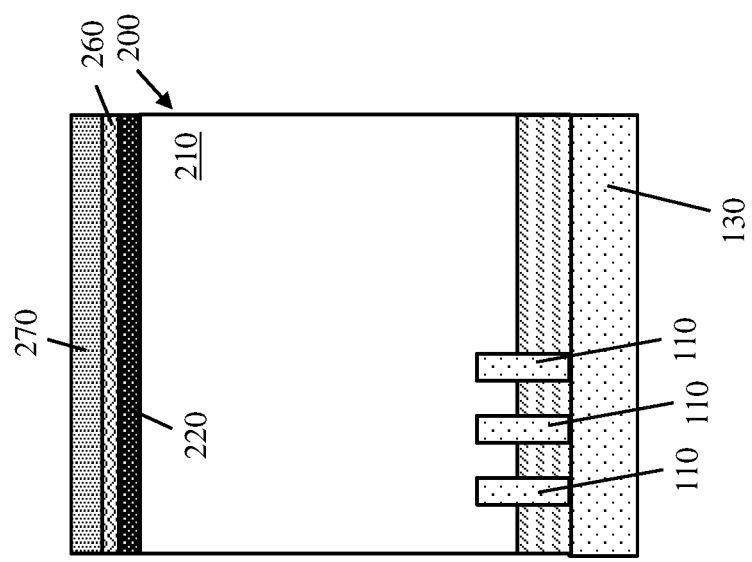
FIG. 14 shows a longitudinal cross-sectional view of forming an insulative liner and anti-reflective film within the first marking trench according to the disclosure.
Figure 13:
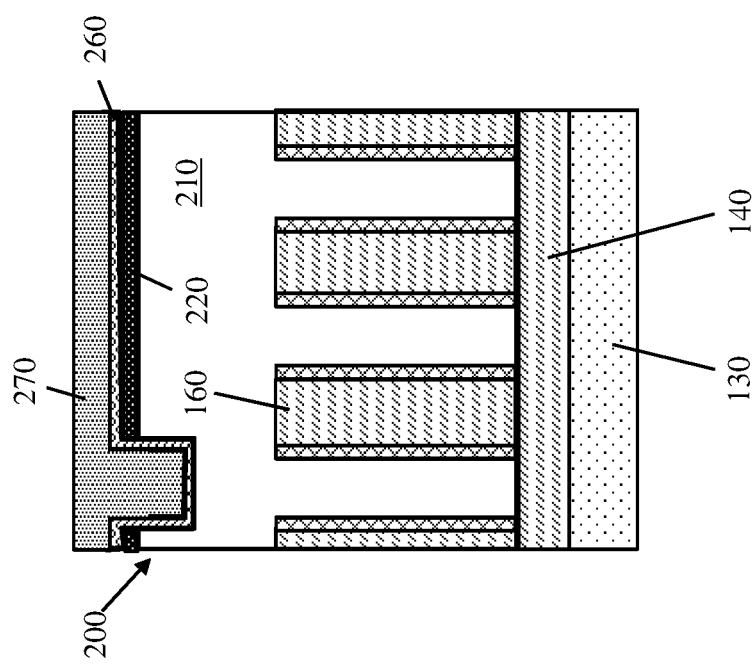
FIG. 13 shows a lateral cross-sectional view of forming an insulative liner and anti-reflective film within the first marking trench according to the disclosure.

Referring to FIGS. 13 and 14, continued processing may include covering first alignment trench 250 (FIGS. 11, 12) with other materials to allow another alignment trench to be formed within soft mask 200 at another location. Continued processing may therefore include forming an insulative liner 260 within first alignment trench 250 and on soft mask 250. Insulative liner 260 may be composed of any currently known or later developed electrically insulative material, e.g., titanium oxide (TiOx), other oxide insulators, and/or other insulating materials discussed herein relative to insulator 160. To prepare regions outside first alignment trench 250 for additional lithographic processing, and to create a substantially planar surface, the disclosure includes forming an anti-reflective film 270 on insulative liner 260, and within portions of alignment trench 250. Anti-reflective film 270 can be formed to a greater thickness than anti-reflective coating 220 and precursor anti-reflective film 230 (FIGS. 7-10) where applicable. After being formed, anti-reflective film 270 may be self-planarized or planarized by other processes (e.g., via chemical mechanical planarization) such that anti-reflective film 270 exhibits a substantially planar upper surface.

Figure 16:
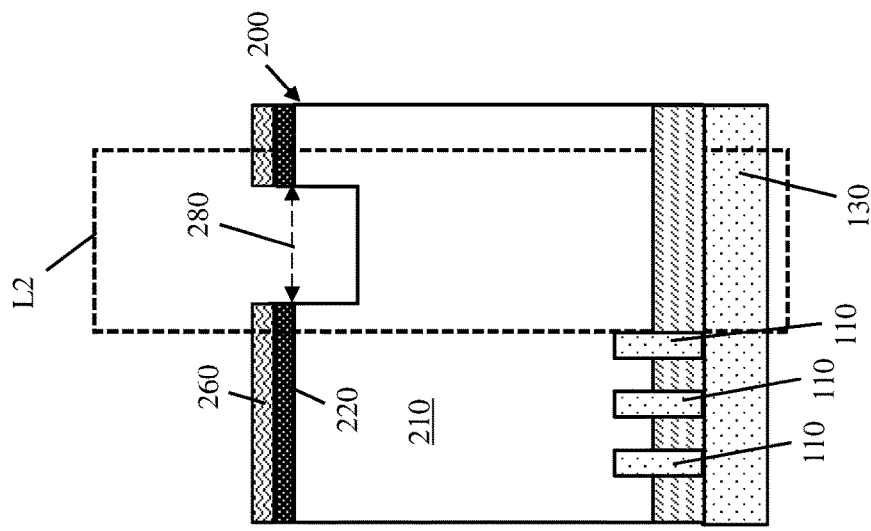
FIG. 16 shows a longitudinal cross-sectional view of forming an opening in the soft mask at a second location and removing the anti-reflective film according to embodiments of the disclosure.
Figure 15:
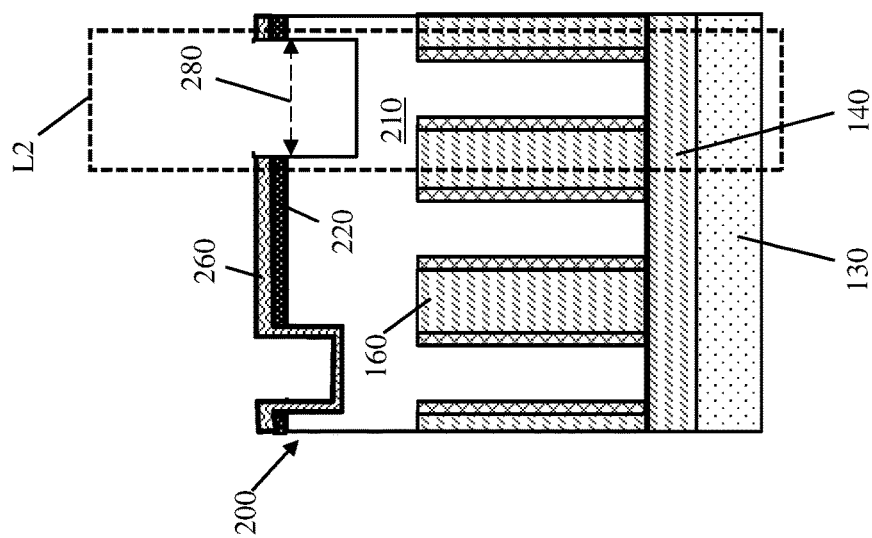
FIG. 15 shows a lateral cross-sectional view of forming an opening in the soft mask at a second location and removing the anti-reflective film according to embodiments of the disclosure.

Turning to FIGS. 15 and 16 together, the disclosure includes forming a second alignment trench 280 within soft mask 200, and at second location L2 over the original position of another gate trench 170 (FIGS. 5 and 6). Second alignment trench 280 can be formed pursuant to the same process of forming first alignment trench 250 (FIG. 11), e.g., forming a photoresist layer (not shown) on anti-reflective film 270 (FIGS. 13 and 14) and removing materials not covered by the photoresist layer via selective or non-selective etching. Where applicable, any photoresist layers formed on insulative liner 260 can fill and cover the previously-formed opening in soft mask 210. The etching may form a second alignment trench 280 which extends at least partially into soft mask 200 (e.g., through planarization layer 210 and anti-reflective coating 220) as well as through insulative liner 260 and/or anti-reflective coating 220. The previously-formed alignment trench, now covered by insulative liner 260, can remain intact (e.g., by being covered by a photoresist layer) to retain substantially the same dimensions, position, etc. Anti-reflective film 270 can subsequently be removed by stripping and/or selective etching, with the remainder of insulative liner 260 optionally being left intact. Leaving insulative liner 260 intact on other portions of soft mask 200 can allow second alignment trench 280 to have different dimensions from first alignment trench 250, e.g., by being formed and processed separately and with a different pattern. At this stage, two portions of soft mask 200 have been removed in order to memorize the location where features will be formed on underlying materials. One advantage of the processing methodology herein may include the ability to form second alignment trench 280 at a different size from first alignment trench 250. For example, as shown in FIGS. 15 and 16, the lateral width of second alignment trench 280 can be greater than that of first alignment trench 250.

Figure 17:
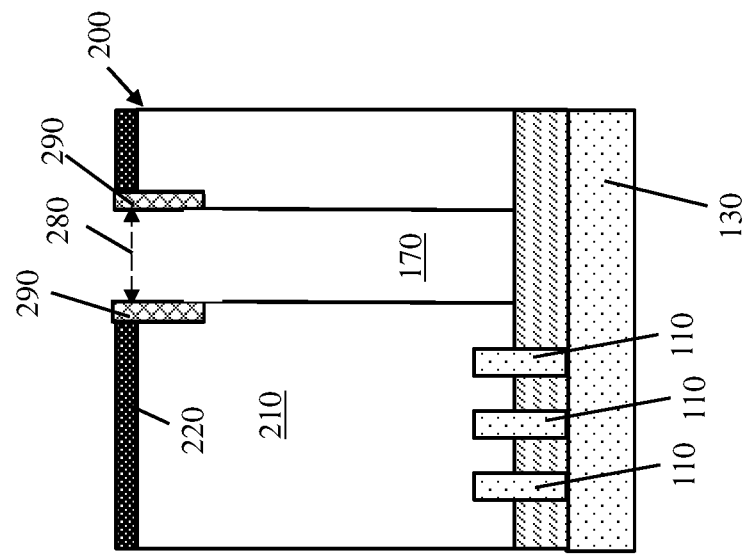
FIG. 17 shows a lateral cross-sectional view of forming spacers and exposing a lower surfaces of a pair of gate trenches according to the disclosure.
Figure 18:
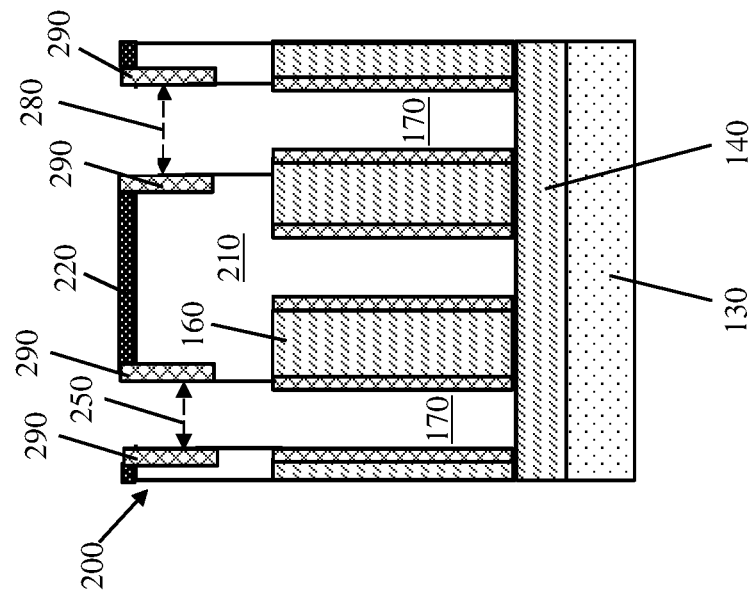
FIG. 18 shows a longitudinal cross-sectional view of forming spacers and exposing a lower surfaces of a pair of gate trenches according to the disclosure.

Proceeding to FIGS. 17 and 18, underlying portions of soft mask 200 can also be removed to allow features to be formed on substrate 130 and/or STI(s) 140, after first and second alignment trenches 250, 280 have been formed. According to an example, insulative liner 260 can be removed (e.g., by selective etching) to expose the underlying structure of soft mask 200, e.g., anti-reflective coating 220. Groups of inner spacers 290 may be formed subsequently on exposed sidewalls of each alignment trench 250, 280 to adjust the critical dimension of the target structure. Further processing may then include removing portions of soft mask 200 (e.g., planarization layer 210), and re-expose underlying portions of gate trenches 170 above substrate 130 and/or STI(s) 140. Portions of soft mask 200 may be removed by way of selective etching, and such that each portion beneath alignment trench 250, 280 is removed by a respective mask in multiple patterning lithography. As shown, the re-exposed gate trenches 170 can be laterally separated by substantially the width of only one initial gate trench 170, thereby allowing features to be formed via multiple patterning lithography in close proximity to each other. Each gate trench 170 can subsequently be filled with a conductive or insulative material pursuant to design specifications and/or conventional techniques. However, forming first and second alignment trenches 250, 280 as described herein may allow for the use of only one soft mask 200 to form multiple alignment trenches 250, 280 with distinct dimensions and at different positions (e.g., first and second locations L1, L2).

Figures 19, 20:
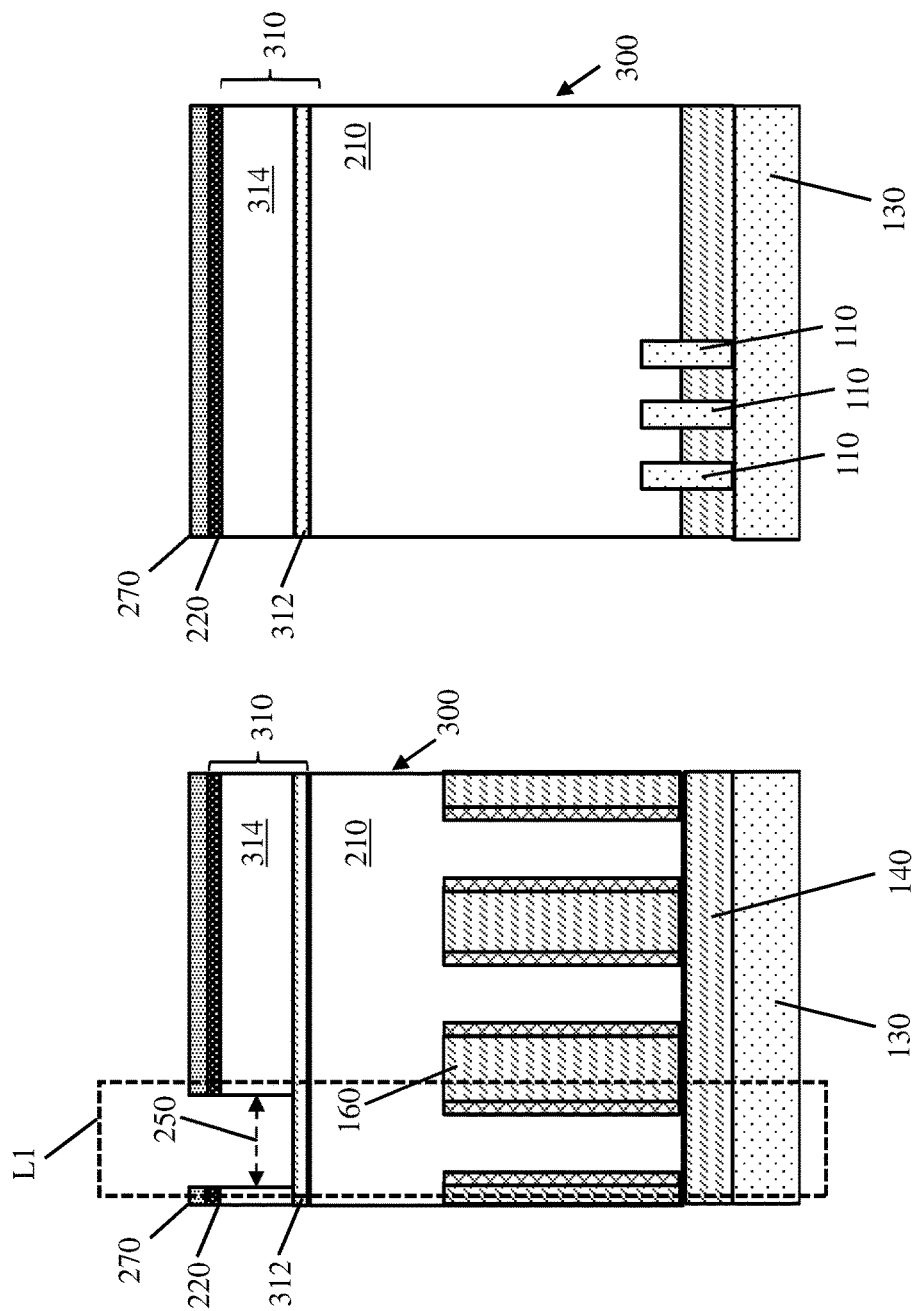
FIG. 19 shows a lateral cross-sectional view of forming a soft mask with a capping insulator and anti-reflective film according to the disclosure.
FIG. 20 shows a longitudinal cross-sectional view of forming a soft mask with a capping insulator and anti-reflective film according to the disclosure.

Turning to FIGS. 19 and 20, further embodiments may contemplate forming multiple alignment trenches with the aid of different soft masks. To this extent, FIGS. 19 and 20 depict forming a soft mask 300 with the structure of FIGS. 5 and 6, with soft mask 300 including further materials in addition to various layers described herein. In an example implementation, each soft mask 300 can include planarization layer 210 including, e.g., one or more OPL materials as discussed herein, with a capping insulator 310 positioned on planarization layer 210. Capping insulator 310 may be formed from one or more of the same insulating materials included in STI(s) 140 and/or insulator 160, or may be formed from yet another currently known or later developed electrically insulative material. In a more specific example, capping insulator 310 may include multiple layers of insulating material. According to an example, capping insulator 310 may include a low temperature oxide (LTO) layer 312 formed on planarization layer 210. Capping insulator 310 may also include, e.g., a nitride layer 314 positioned on LTO layer 312 and including one or more currently known or later developed nitride insulators, e.g., silicon nitride (SiN).

Capping insulator 310 can vertically separate planarization layer 210 from overlying materials, during initial processes for defining the position and size of each alignment trench. Similar to further embodiments described herein, soft mask 300 may include an anti-reflective coating 220 on an upper surface of capping insulator 310 and, optionally, a first anti-reflective film 270 positioned on anti-reflective coating 220. Despite the presence of capping insulator 310, first alignment trench 250 can be formed at first location L1 substantially in accordance with other techniques described herein, e.g., using a photoresist layer and vertical etching to remove targeted portions of anti-reflective coating 220, anti-reflective coating 270, and/or capping insulator 310. However, at least part of capping insulator 310 (e.g., LTO layer 312) and planarization layer 210 may initially remain intact as first anti-reflective film 270 is formed. These materials may be removed in subsequent processing, e.g., after multiple alignment trenches have been formed.

Referring briefly to FIGS. 21 and 22, continued processing with soft mask 300 can proceed substantially in accordance with other embodiments discussed herein, e.g., forming antireflective coating 220 and first anti within first alignment trench 250 and forming a second anti-reflective film 275 within first alignment trench 250 and over anti-reflective coating 220. Second anti-reflective film 275 can be formed as an additional layer on first anti-reflective film 270 (FIGS. 19 and 20), or may be formed by removing anti-reflective coating 220 before forming second anti-reflective film 275. However formed, anti-reflective coating 220 and second anti-reflective film 275 can fill first alignment trench 250 and create a substantially planar surface to allow the subsequent forming of another alignment trench.

Figures 23, 24:
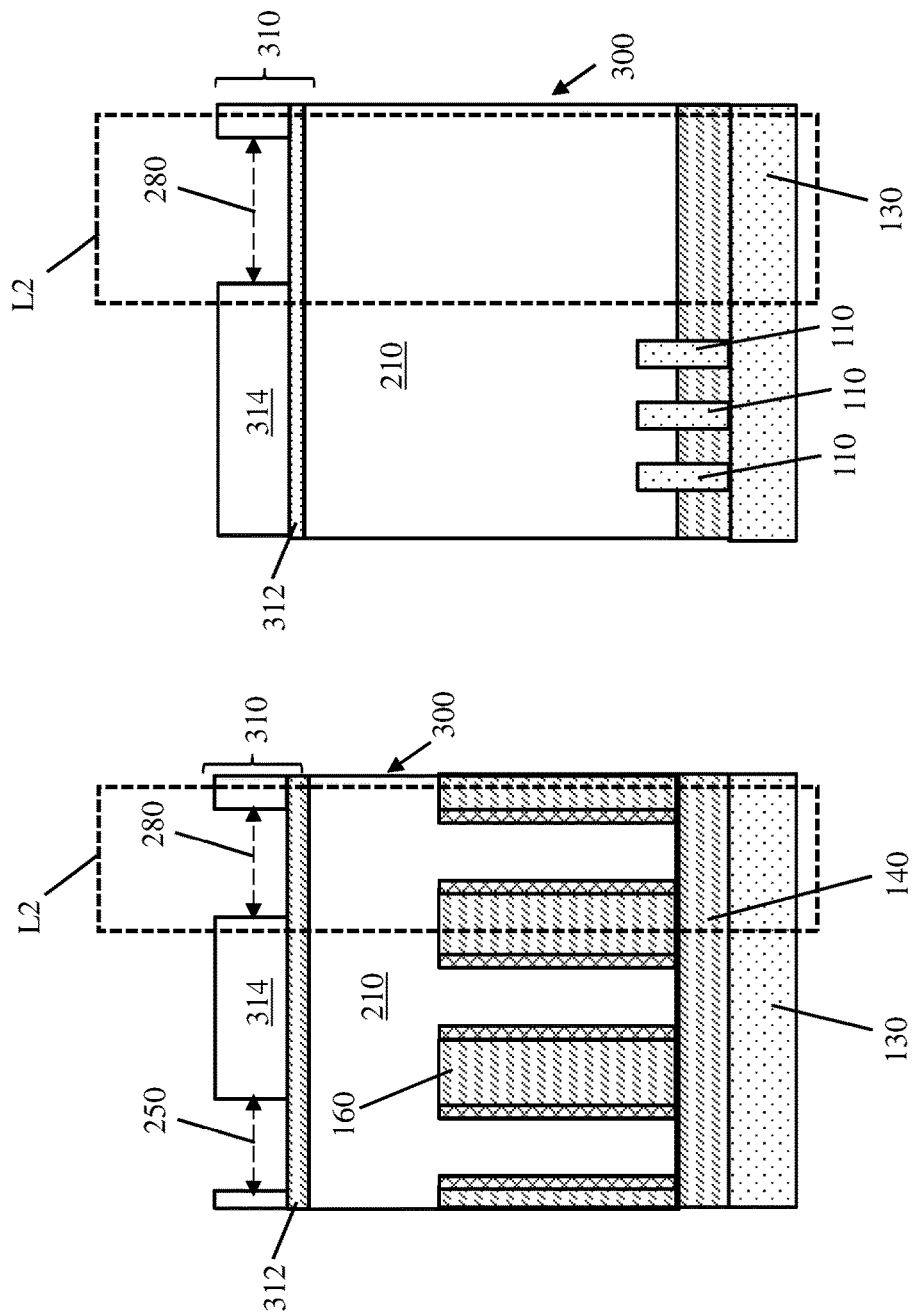
FIG. 23 shows a lateral cross-sectional view of forming a second marking trench within the soft mask according to the disclosure.
FIG. 24 shows a longitudinal cross-sectional view of forming a second marking trench within the soft mask according to the disclosure.

FIGS. 23 and 24, together, depict the forming of second alignment trench 280 within capping insulator 310, and at second location L2. Second alignment trench 280 may be formed within at least one portion (e.g., nitride layer 314) of capping insulator 310 without exposing soft mask 300 thereunder. Anti-reflective coating 220 and second anti-reflective film 275 can then be removed, e.g., by selective etch, after second alignment trench 290 is formed within capping insulator 310. The removing of anti-reflective coating 220 and anti-reflective film 275 can also re-expose first alignment trench 250 within capping insulator 310.

Proceeding to FIGS. 25 and 26, portions of soft mask 300 or capping insulator 310 positioned under each alignment trench 250, 280 can be removed, e.g., by a selective vertical etch. Such vertical etching can remove exposed portions of planarization layer 210 and/or LTO layer 312 without initially exposing any portion of the covered gate trenches 270. In this manner, soft mask 300 can be used in conjunction with capping insulator 310 to target specific regions of a structure (e.g., first and second locations L1, L2 (FIGS. 23, 24) for removal.

Figure 27:
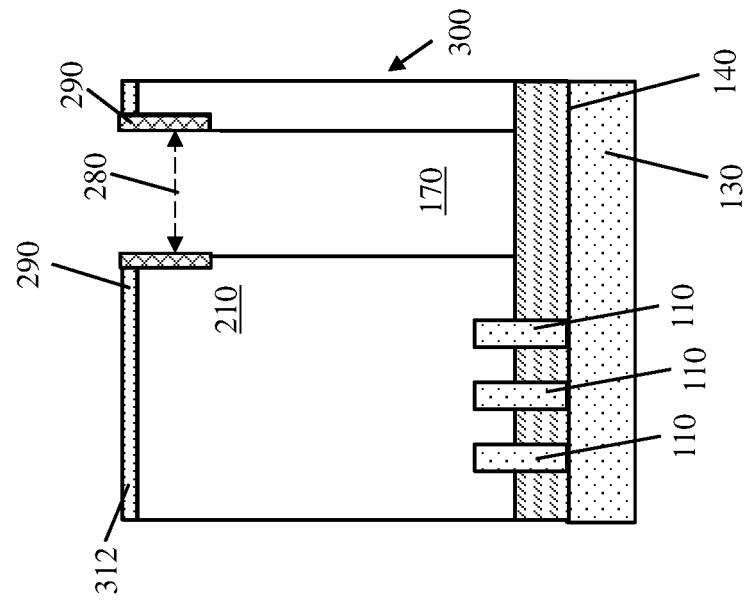
FIG. 27 shows a lateral cross-sectional view of forming spacers and exposing the lower surfaces of a pair of gate trenches according to the disclosure.
Figure 28:
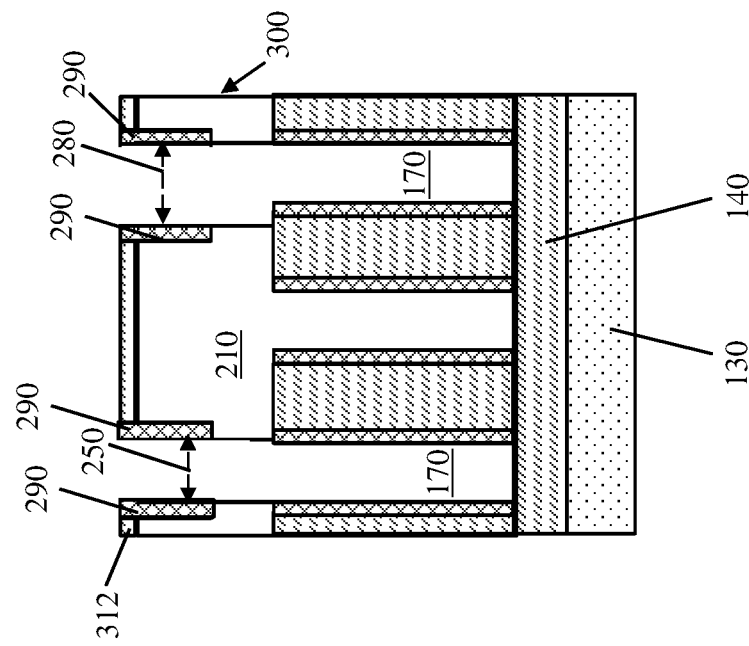
FIG. 28 shows a longitudinal cross-sectional view of forming spacers and exposing the lower surfaces of a pair of gate trenches according to the disclosure.

Referring now to FIGS. 27 and 28, subsequent processing may be implemented with soft mask 300 substantially in the same manner as with soft mask 200 (FIGS. 7-18). Specifically, portions of soft mask 300 exposed from prior etching of first and second alignment trenches 250, 280 can be removed through vertical etching to re-expose gate trenches 170 and underlying portions of fin(s) 110 and/or STI(s) 140 at the bottom of each gate trench 170. The exposed gate trenches 170 may be separated by only one of the originally formed gate trenches 170, thereby creating a separation distance between each alignment trench 250, 280 of no more than approximately ten nanometers. As with other implementations using mask 200, inner spacers 290 may be formed on sidewalls of planarization layer 210 and/or LTO layer 312 before the deepening of each alignment trench 250, 280. Despite differences in the structure of soft mask 300 as compared to soft mask 200, the embodiments described herein may yield differently-sized first and second alignment trenches 250, 290 without forming multiple soft masks 300. It is thus understood that the processes described herein may be implemented in a modified form on still further soft masks without departing from the principles of the disclosure.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an integrated circuit (IC) structure, the method comprising:
    forming a soft mask on an upper surface of an insulator, and within a pair of gate trenches extending below the upper surface of the insulator;
    forming a first marking trench within the soft mask by selectively removing a portion of the soft mask at a first location, over one of the pair of gate trenches;
    forming an insulative liner on the soft mask and within the first marking trench;
    forming a first anti-reflective film on the insulative liner and within the first marking trench;
    selectively removing the first anti-reflective film and the insulative liner at a second location to expose a portion of the soft mask positioned over the other one of the pair of gate trenches;
    forming a second marking trench by removing another portion of the soft mask at the second location; and
    removing a portion of the soft mask at the first and second marking trenches to expose a lower surface of each of the pair of gate trenches.

2. The method of claim 1, wherein forming the soft mask includes forming a planarization layer on a single gate structure positioned on the insulator laterally between the first and second locations.

3. The method of claim 1, wherein a lateral width of the first marking trench is different from a lateral width of the second marking trench.

4. The method of claim 1, wherein a separation distance between the first and second marking trenches is at most approximately ten nanometers (nm).

5. The method of claim 1, wherein the insulative liner comprises titanium oxide (TiOx).

6. The method of claim 1, wherein the soft mask includes an organic planarization layer (OPL) and an anti-reflective coating positioned on the OPL, the anti-reflective coating including one of a silicon-containing antireflective coating (SiARC), a silicon oxynitride (SiON) material, or a low temperature oxide (LTO) material.

7. The method of claim 1, wherein selectively removing the first anti-reflective film and the insulative liner at the second location includes removing the first anti-reflective film from the first marking trench to expose the insulative liner therein.

8. The method of claim 1, further comprising removing the insulative liner from the first marking trench, before forming the second marking trench.

9. The method of claim 1, further comprising:
    forming a precursor anti-reflective film on the soft mask; and
    selectively removing the precursor anti-reflective film before forming the insulative liner on the soft mask.

10. The method of claim 1, further comprising forming a pair of inner spacers on sidewalls of each of the first and second marking trenches before removing the soft mask at the first and second marking trenches.

11. A method of forming an integrated circuit (IC) structure, the method comprising:

forming a soft mask on an upper surface of an insulator, and within a pair of gate trenches extending below the upper surface of the insulator, the soft mask including:
  an organic planarization layer (OPL) positioned on an upper surface of the insulator and within the pair of gate trenches,
  a capping insulator positioned on the OPL, and
  a first anti-reflective film positioned on the capping insulator;
forming a first marking trench by selectively removing the first anti-reflective film and a portion of the capping insulator at a first location;
forming an insulative liner on the capping insulator and within the first marking trench;
forming a second anti-reflective film on the insulative liner and within the first marking trench;
forming a second marking trench by selectively removing the second anti-reflective film, the insulative liner, and another portion of the capping insulator at a second location; and
removing the capping insulator and the OPL at the first and second marking trenches to expose a lower surface of each of the pair of gate trenches.

12. The method of claim 11, wherein forming the soft mask includes forming a planarization layer on a single gate structure positioned on the insulator laterally between the first and second locations.

13. The method of claim 11, wherein a separation distance between the first and second marking trenches is at most approximately ten nanometers (nm).

14. The method of claim 11, wherein the insulative liner comprises titanium oxide (TiOx).

15. The method of claim 11, wherein the first anti-reflective film comprises one of a silicon-containing antireflective coating (SiARC), a silicon oxynitride (SiON) material, or a low temperature oxide (LTO) material.

16. The method of claim 11, wherein selectively removing the second anti-reflective film, the insulative liner, and the another portion of the capping insulator at the second location includes removing the second anti-reflective film and the insulative liner from the first marking trench.

17. The method of claim 11, further comprising forming an anti-reflective coating on the soft mask, before forming the capping insulator.

18. The method of claim 11, further comprising forming a pair of inner spacers on sidewalls of each of the first and second marking trenches, before removing the OPL at the first and second marking trenches.

19. The method of claim 11, wherein the capping insulator includes:
  a low temperature oxide (LTO) layer positioned on the OPL; and
  a nitride layer positioned on the LTO layer, wherein a bottom surface of the first marking trench and a bottom surface of the second marking trench are substantially coplanar with an upper surface of the LTO layer.

20. A method of forming an integrated circuit (IC) structure, comprising:
  forming a soft mask on an upper surface of an insulator, and within a pair of gate trenches extending below the upper surface of the insulator, the soft mask including:
    an organic planarization layer (OPL) positioned on an upper surface of the insulator and within the pair of gate trenches, and
    a first anti-reflective film positioned on the OPL;
  forming a first marking trench within the OPL and the first anti-reflective film by selectively removing the first anti-reflective film and a portion of the OPL at a first location to expose an underlying portion of the OPL within one of the pair of gate trenches;
  forming an insulative liner the on the first anti-reflective film and the OPL, and within the first marking trench;
  forming a second anti-reflective film on the insulative liner and within the first marking trench;
  selectively removing the second anti-reflective film, the insulative liner, and the second anti-reflective film at a second location to expose a portion of the OPL over the other one of the pair of gate trenches, such that a portion of the insulative liner remains within the first marking trench;
  forming a second marking trench by removing a remainder of the second anti-reflective film and a portion of the OPL at the second location, without removing the insulative liner from the first marking trench; and
  removing the OPL at the first and second marking trenches to expose a lower surface of each of the pair of gate trenches.

* * * * *